(12) United States Patent
Heo et al.

(10) Patent No.: US 9,813,088 B2
(45) Date of Patent: Nov. 7, 2017

(54) SUPPLY MODULATORS WITH VOLTAGE AND FREQUENCY PARTITIONING

(71) Applicant: Washington State University, Pullman, WA (US)

(72) Inventors: Deukhyoun Heo, Pullman, WA (US); Zhiyuan Zhou, Pullman, WA (US); Nghia Tang, Pullman, WA (US)

(73) Assignee: Washington State University, Pullman, WA (US)

( * ) Notice: Subject to any disclaimer, the term of this patent is extended or adjusted under 35 U.S.C. 154(b) by 0 days.

(21) Appl. No.: 15/224,513

(22) Filed: Jul. 30, 2016

(65) Prior Publication Data

US 2017/0033811 A1 Feb. 2, 2017

Related U.S. Application Data

(60) Provisional application No. 62/199,917, filed on Jul. 31, 2015.

(51) Int. Cl.
*H04L 25/03* (2006.01)
*H04B 1/04* (2006.01)
(Continued)

(52) U.S. Cl.
CPC ......... *H04B 1/0475* (2013.01); *H03F 1/0227* (2013.01); *H03F 3/19* (2013.01);
(Continued)

(58) Field of Classification Search
CPC .... H03F 2200/102; H03F 1/0227; H03F 3/24; H03F 1/02; H03F 1/32; H03F 1/0211; H03F 1/3241; H03F 2200/105; H03F 2200/375; H03F 1/025; H03F 1/30; H03F 1/3282; H03F 3/19; H03F 3/21; H03F 3/211; H03F 3/2173; H03F 3/245; H03F 2200/351; H03F 2203/21181; H03F 2203/21184; H03F 2203/21193;
(Continued)

(56) References Cited

U.S. PATENT DOCUMENTS 9,300,255 B2 * 3/2016 Takeuchi .................. H03F 1/32
2004/0263245 A1 * 12/2004 Winter .................. H03F 1/0222
330/10
(Continued)

*Primary Examiner* — Khanh C Tran
(74) *Attorney, Agent, or Firm* — Liang IP, PLLC

(57) ABSTRACT

Techniques to improve efficiencies of power amplifiers in wireless communication devices are described herein. In one embodiment, an envelope tracking supply modulator includes a pre-amplifier having an input coupled to an envelope signal and another input coupled to a threshold voltage signal, a de-multiplexer coupled to an output of the pre-amplifier, a pulse frequency modulator having an input coupled to an output of the de-multiplexer, and a pulse width modulator having an input coupled to the output of the de-multiplexer. The de-multiplexer is configured to allow the pulse frequency modulator to modulate a switching frequency to generate a switched signal according to a slew rate of the envelope signal or allow the pulse width modulator to provide the switched signal as a current source with a constant frequency, based on a comparison result between the envelope signal and the threshold voltage signal at the pre-amplifier.

20 Claims, 3 Drawing Sheets

(51) Int. Cl.
  *H03F 3/21* (2006.01)
  *H03F 1/02* (2006.01)
  *H03F 3/24* (2006.01)
  *H03F 3/19* (2006.01)
  *H03F 3/217* (2006.01)

(52) U.S. Cl.
  CPC .............. *H03F 3/21* (2013.01); *H03F 3/211* (2013.01); *H03F 3/2173* (2013.01); *H03F 3/245* (2013.01); *H03F 2200/102* (2013.01); *H03F 2200/348* (2013.01); *H03F 2200/351* (2013.01); *H03F 2200/432* (2013.01); *H03F 2200/451* (2013.01); *H03F 2200/555* (2013.01); *H04B 2001/045* (2013.01); *H04B 2001/0416* (2013.01)

(58) Field of Classification Search
  CPC ........... H03F 2200/507; H04L 27/3411; H04L 27/367; H04L 27/3809; H04L 27/368; H04B 1/0475; H04B 2001/0408; H04B 2001/0416; H04B 2001/0425; H03G 3/3042; H03G 3/004
  See application file for complete search history.

(56) References Cited

U.S. PATENT DOCUMENTS

| | | | |
|---|---|---|---|
| 2007/0018718 A1* | 1/2007 | Horng .................. | H03F 1/0227 330/10 |
| 2010/0019840 A1* | 1/2010 | Takahashi ............. | H03F 1/0211 330/3 |
| 2015/0048890 A1* | 2/2015 | Takeuchi ................. | H03F 1/32 330/291 |

* cited by examiner

SUPPLY MODULATORS WITH VOLTAGE AND FREQUENCY PARTITIONING

CROSS-REFERENCE TO RELATED APPLICATION(S)

This application is a Non-provisional application of and claims priority to U.S. Provisional Application No. 62/199,917, filed on Jul. 31, 2015.

BACKGROUND

Modern wireless communication devices can utilize radio frequency ("RF") modulators to convert various types of source signals to modulated signals for transmission to receiving devices. For example, an RF modulator at a first cellular phone can convert voice signals collected from a user via a microphone to modulated RF signals. The first cellular phone can then transmit the modulated RF signals via a wireless mobile network to be received by a second cellular phone. The second cellular phone can then reproduce the voice signals from the user based on the received RF signals.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Though current wireless mobile networks can accommodate a large amount of data traffic, such mobile networks can be incapable of supporting enormous network-data-traffic demands arising from a large number of new mobile devices and ubiquitous sensor nodes of Internet of Things (IoT). One technological solution to tackle this issue is to utilize mm-wave massive multi-user multi-input multi-output (MMU-MIMO) wireless communication systems. Such MMU-MIMO communication systems can include power amplifiers (PA) in base stations in order to communicate with receivers of subscribers that are distributed in cells. However, PAs can lack sufficient efficiencies. Making PAs more efficient often involves driving the PAs to a point near (or beyond) a point of saturation, which can result in distortions of modulated waveforms. Modern digital modulation often involves densely encoding data to achieve spectral efficiencies. Both amplitude and phase modulation can require a highly linear communication channel in order to generate reproducible high-definition content at a receiver. To improve amplifier linearity, one often "backs-off" on amplifier driving voltages, which can lower efficiency. As such, improving linearity often hinders efficiencies of Pas, and vice versa.

One solution to improve back-off efficiencies include utilizing envelope-tracking (ET), envelope-elimination and restoration (EER), Doherty amplifier, or radio frequency-digital analog converters (RF-DACs). Envelope-Tracking involves modulate a supply power of a PA to track the "amplitude envelope" of a source signal to achieve much greater efficiencies than utilizing constant supply power. The modulated supply voltage can be highest during periods of peak modulation and lowest during periods of minute modulation. An EER amplifier generates a signal component representative of an envelope and/or phase of an input signal and couples the signal component to a supply input of a power amplifier configured to provide the supply power. As such, the phase of the signal component has an amplitude adjusted corresponding to an envelope value of the signal component. Both of the foregoing solutions, however, require a high bandwidth (BW) supply-modulator (SuMo) for an envelope signal with a wide channel bandwidth.

Future wireless communication systems can use ultra-high bandwidths, such as 250 MHz or greater, to support increasing demands for data throughput. However, as discussed above, current ET supply modulators cannot support such high bandwidths because extending bandwidths can results in significant loss of efficiency. The disclosed technology is directed to an ET supply modulator that can accommodate ultra-high-bandwidth communications. In certain embodiments, an ET supply modulator can include a split-path input configured to receive an envelope signal, a switching regulator configured to partition a low bandwidth frequency region of the envelope signal, a digital linear regulator configured to partition a high bandwidth frequency region of the envelope signal, and a summing circuit electrically coupled to the switching regulator, the digital linear regulator, and a power amplifier. The summing circuit sums output from the switching regulator and the digital linear regulator so that a voltage supplied to the power amplifier efficiently tracks the amplitude variations of the envelope signal with little or no reduction in efficiency.

DETAILED DESCRIPTION

Certain embodiments of systems, devices, articles of manufacture, and processes for providing supply modulators with voltage frequency partitioning are described below. In the following description, specific details of components are included to provide a thorough understanding of certain embodiments of the disclosed technology. A person skilled in the relevant art will also understand that the disclosed technology can have additional embodiments or can be practiced without several of the details of the embodiments described below with reference to FIGS. 1-3B.

In the description herein, a word appearing in the singular encompasses corresponding plural counterpart, and a word appearing in the plural encompasses corresponding singular counterpart, unless implicitly or explicitly understood or stated otherwise. Moreover, the terms used herein unless otherwise specified have the meanings commonly understood by those skilled in the art. Furthermore, for any given component or embodiment described herein, any of the possible candidates or alternatives listed for that component can generally be used individually or in combination with one another, unless implicitly or explicitly understood or stated otherwise.

The term "connected" is used herein to describe a direct connection between two circuit elements, for example, by way of a metal line formed in accordance with normal integrated circuit fabrication techniques. In contrast, the term "coupled" is used herein to describe either a direct connection or an indirect connection between two circuit elements. For example, two coupled elements can be directly connected by way of a metal line, or indirectly connected by way of an intervening circuit element (e.g., a capacitor, a resistor, an inductor, or a transistor). Additionally, unless otherwise indicated, numbers expressing quantities of ingredients, constituents, reaction conditions and so forth used in the specification and claims are to be understood as being modified by the term "about."

Certain wireless communication systems can face difficulties in non-linearity and poor back-off power efficiencies of power amplifiers (PA), especially for modulation schemes (e.g., M-QAM with FDMA) with high peak-to-average power ratios. The disclosed technology is directed to address at least some of the foregoing limitations by implementing a wide-bandwidth and high-efficiency hybrid supply modulator. In certain embodiments, the hybrid supply modulator can include a digital linear regulator (DLR) and a switching regulator (SR) with on-chip low pass filter (LPF), for envelope tracking amplifiers, such as E-band ET PAs with up to about 300 MHz, up to about 250 MHz, or up to other suitable values of channel bandwidth (BW).

Figure 1:
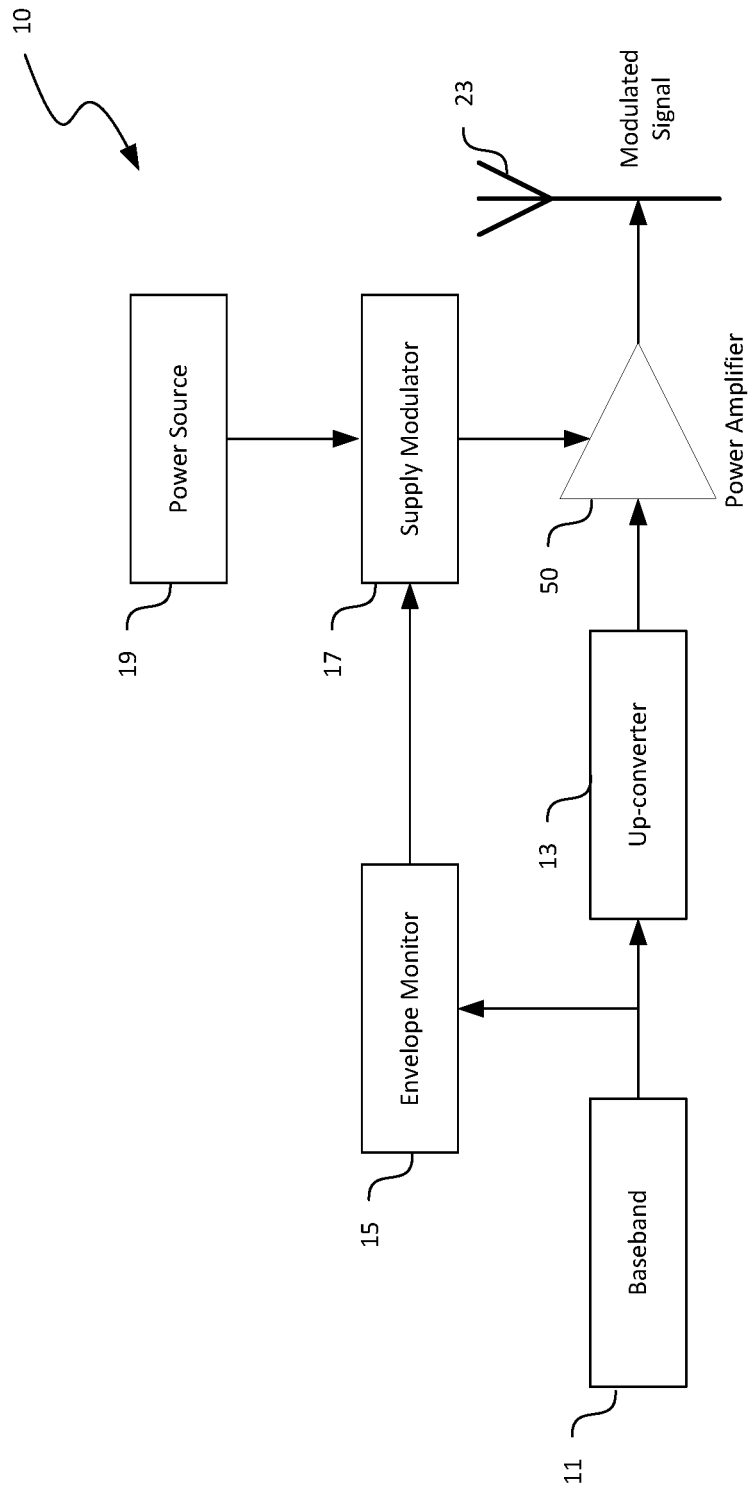
FIG. 1 is a schematic diagram of an envelope tracking power amplifier in accordance with embodiments of the disclosed technology.

FIG. 1 is a schematic diagram of an envelope tracking power amplifier 10 in accordance with embodiments of the disclosed technology. Certain embodiments of the envelope tracking power amplifier 10 can be incorporated into cellular phones, satellite transmitters, or other suitable types of devices configured to facilitate communications via modulation and/or de-modulation of radio frequency signals. Even though particular components are shown in FIG. 1, in other embodiments, the envelope tracking power amplifier 10 can also include low pass filters, shaping tables, or other suitable components.

As shown in FIG. 1, the envelope tracking power amplifier 10 can include a baseband module 11, an up-converter 13, a power amplifier 50, and an antenna 23 operatively coupled in series. The envelope tracking power amplifier 10 can also include an envelope monitor 15 coupled to the baseband module 11 and a supply modulator 17 coupled to the envelope monitor 15 and a power source 19. In certain embodiments, the power source 19 can include a battery. In other embodiments, the power source 19 can include a suitable power source from an alternate current source or other suitable sources.

The baseband module 11 can be configured to provide an envelope signal to the up-converter 13 that is configured to increase a frequency of the envelope signal from the baseband module 11 to generate an up-converted signal. The envelope signal can include a signal collected, for example, from a microphone of a cellular phone, from a video camera, or from other suitable content sources. The power amplifier 50 can then modulate the up-converted signal based on a power signal supplied from the supply modulator 17 before transmitting the modulate signal to a receiving device (not shown) via the antenna 23.

The envelope monitor 15 can be configured to detect an envelope voltage of the envelope signal, for example, by taking a power magnitude of real and imaginary components of the envelope signal. In certain embodiments, a shaping table can be utilized to map the power magnitude to an envelope signal having a corresponding voltage supply on the power amplifier 50. In other embodiments, other suitable operations can also be performed to "shape" or otherwise condition the obtained signal of power magnitude of the envelope signal. The envelop monitor 15 can then provide the envelop signal to the supply modulator 17 for generating an envelope tracked power signal to the power amplifier 50.

One example suitable for the supply modulator 18 is described in more detail below with reference to FIG. 2.

Figure 2:
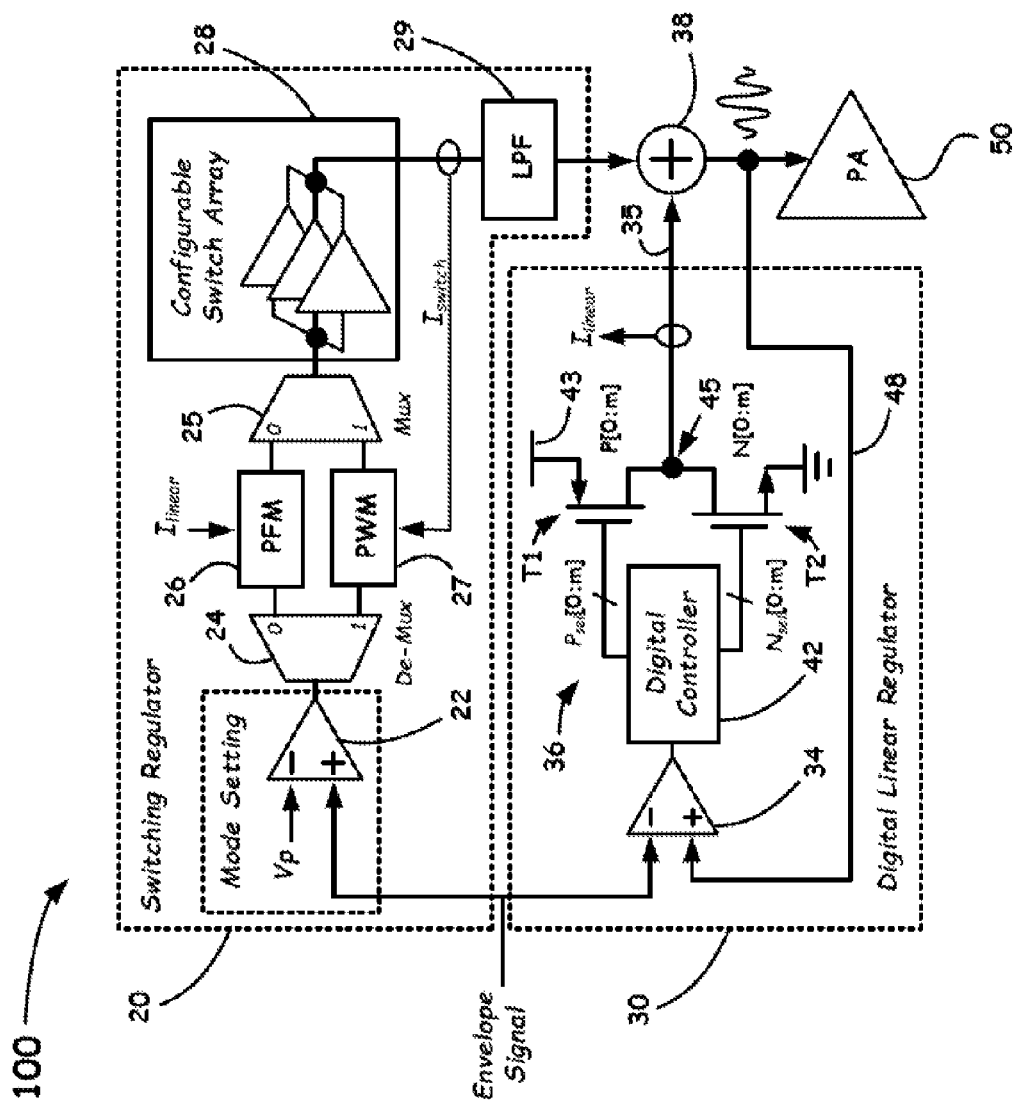
FIG. 2 is a schematic diagram of a supply modulator suitable for the envelope tracking power amplifier of FIG. 1.

FIG. 2 is a schematic diagram of a supply modulator 100 suitable for the envelope tracking power amplifier 10 of FIG. 1. To efficiently increase a slew rate and speed of the supply modulator 100 to track the envelope signal at, for example, 250 MHz-300 MHz, the supply modulator 100 utilizes a DLR instead of an analog linear amplifier to implement a digital control loop to regulate an output voltage of the supply modulator 100 by selectively turning unit cells on/off in a Metal Oxide Field Effect Transistor (MOSFET), a Metal Semiconductor Field Effect Transistor (MESFET), other suitable field effect transistor (FET), or a bipolar transistor power network, as described in more detail below. Digital voltage regulation allows quick change of output current, leading to higher slew rates than in analog linear amplifiers. Several embodiments of the supply modulator 100 can be configured to implement tracking the envelope signal and to suppress switch ripples form switching regulators. Experiments showed that power consumption of embodiments of the supply modulator 100 was an order of magnitude smaller than that of an analog linear amplifier for tracking envelope signals up to about 250 MHz or 300 MHz.

Embodiments of the control methods and designs of the supply modulator 100 disclosed herein can be used in envelope elimination and restoration (EER), and/or envelope tracking (ET) systems employing a voltage- and/or frequency-partitioning modulation (VFPM). Because a power envelope of an input signal is tracked in both EER and ET approaches, the term "envelope tracking" (or "ET") is used herein in the most general sense and can refer to one or both ET and EER systems.

As shown in FIG. 2, the supply modulator 100 can include an SR 20 having on-chip low-pass filter (LPF) 29, a DLR 30, a summing circuit 38, and a PA 50 operatively coupled to one another. Various functionality of the SR 20 and DLR 30 can be implemented as hardware components or software code to be executed by a processor(s) of any other computer system that can include a network server, a desktop computer, and/or other suitable computing devices of various circuitry of a known type, such as, but not limited to, by any one of or a combination of general or special-purpose processors (digital signal processor (DSP)), firmware, software, and/or hardware circuitry for the example configurations disclosed herein.

It is to be noted that in using such example computing devices, the incorporated individual software modules, components, and routines can be a computer program, procedure, or process written in suitable programming languages. Various implementations of the source, intermediate, and/or object code and associated data can be stored in one or more computer readable storage media that include read-only memory, random-access memory, magnetic disk storage media, optical storage media, flash memory devices, and/or other suitable media. A computer-readable medium, in accordance with aspects of the present disclosure, refers to media that have encoded information provided in a form that can be read (i.e., scanned/sensed) by a computer or processor and interpreted by the machine's/computer's/processor's hardware and/or software. The term "computer readable storage medium" excludes propagated signals, per se.

As shown in FIG. 2, the supply modulator 100 can have a hybrid design of the SR 20 and DLR 30. In such a hybrid design, the voltage output of the DLR 30 and the SR 20 can be matched to prevent one regulator (e.g., the SR 20) from driving the output and negating the contribution of the DLR 30. The voltage match between the SR20 and DLR 30 can be achieved by, for example, monitoring an average current delivered to the PA 50. A positive average current from the DLR 30 can indicate that the average voltage of the SR 20 is too low. A negative average current from the DLR 30 can indicate that the voltage of the SR 20 is too high.

Because the DLR 30 can have higher efficiencies than the SR 20 for high envelope signal voltages, an threshold partitioning voltage (Vp) can be defined at which the supply modulator 100 switches between first and second operating modes: a DLR-slave mode (DLSM) and a DLR-master mode (DLMM). When the envelope signal is below Vp, the supply modulator 100 can operate in DLSM in which the SR 20 handles low-frequency components (e.g., less than about 100 MHz) of the envelope signal, while the DLR 30 filters any switching ripples of the SR 20 and handles high-frequency components (e.g., higher than about 100 MHz). For envelope signal higher than Vp, the supply modulator 100 can operate in DLMM under which the SR 20 operates as a current-source, and the DLR 30 is fully in charge of envelope tracking supply modulation. Accordingly, the SR 20 disclosed herein can achieve higher average efficiencies than in conventional designs because the SR 20 operates in a smaller output voltage range.

The SR 20 is configured to take small amounts of energy from an input voltage source (e.g., the power source 19 in FIG. 1), and directing such amounts of energy to an output, e.g., the summing circuit 38. To reduce a size of the on-chip LPF 29, the SR 20 is configured to operate at switching frequencies (fsw) at or greater than 250 MHz, 300 MHz, 500 MHz, or other suitable frequency values. It is believed that high switching frequencies tend to degrade efficiency of the SR 20. Beyond a certain output voltage level, the SR 20 can be less efficient than the DLR 30. Thus, a voltage- and frequency-partitioning modulation scheme can be utilized to increase an average efficiency of the supply modulator 100 over a wide output voltage range. As such, both voltage and frequency regions of an envelope signal can be partitioned and assigned to the DLR 30 and SR 20, respectively.

As shown in FIG. 2, the SR 20 can include a mode setting pre-amplifier 22, a pair of de-multiplexer/multiplexer (i.e., De-mux 24 and MUX 25, respectively), a pulse frequency modulator (PFM) 26, a pulse width modulator (PFM) 27, a power switch 28 (shown in FIG. 2 as a configurable switch array), and a low pass filter 29 (e.g., an LC circuit). When the supply modulator 100 is in DLSM, the SR 20 operates in a pulse frequency modulation modality (via PFM 26). As discussed below, the current $I_{linear}$ from DLR 30 provides envelope signal information for the PFM 26 and the SR 20 changes a switching frequency according to a slew rate of the envelope signal. When the supply modulator 100 is in DLMM, the SR 20 operates in a PWM modality with a constant switching frequency of, for example, less than about 500 MHz, 300 MHz, or 250 MHz. By regulating a feedback current $I_{switch}$ to PWM 26, the SR 20 can operate as a current source providing a constant output current to be received by the summing circuit 38, which combines the signals provided by the SR 20 and DLR 30 to provide a summed signal that contains the frequency components of each of the tracked envelope source signals.

The operation of the SR 20 regulator is as follows. When an envelope signal (e.g., at about 0-500 MHz) is to be regulated, such a signal is supplied to the SR 20 via an input of the mode setting pre-amplifier 22. Frequencies higher than, for example, 0-100 MHz can be interrogated by the DLR 30, as discussed below. The envelope signal received by the mode setting pre-amplifier 22 is compared with the threshold partitioning voltage (Vp). The output of the mode setting pre-amplifier 22 is received by a controllably selective de-multiplexer 22 to provide input into either the PFM 26 or the PWM 27. When the supply modulator 100 operates in DLSM, the SR 20 operates in PFM. When the supply modulator 100 operates in DLMM, the SR 20 operates in PWM with a constant frequency switching at about 250 MHz, 300 MHz, or other suitable frequency values. Depending on the operational mode, the output from the PFM 26 or the PWM 27 is received at a multiplexer 25. The power switch 28 then receives output of the multiplexer 25. Thereafter, output of the power switch 28 is received by the LPF 29 to pass frequencies of less than about 300 MHz, 200 MHz, 100 MHz, or other suitable frequency values.

As shown in FIG. 2, the DLR 30 can include a comparator/pre-amplifier stage 34 connected to an output stage 36. A high bandwidth envelope input signal can be received at input terminal 40 (e.g., the non-inverting input) of the comparator/amplifier stage 34, while an output signal 35 can be provided to a load, e.g., the PA 50, via the summing circuit 38. As discussed above, summing circuit 38 can combine the two signals from the SR 20 and DLR 30 to provide a summed signal that contains the frequency components of the desired tracked source envelope signals.

In the illustrated embodiment, the comparator 34 is shown as a single amplifier. However, in other embodiments, the comparator 34 can include more than one amplifier arranged in parallel or series. The comparator 34 can be configured to perform stages of amplification prior to the output stage 36. For example, the comparator 34 can perform low and medium power amplification.

The output stage 36 can include a digital controller circuit 42 and a pair of transistors T1, T2. The transistors T1 and T2 can be any suitable types of transistors including, MOSFET, MESFET, other types of FET, or bipolar transistors. T1 and T2 can be constructed from silicon, gallium arsenide (GaAs), or other suitable semiconductor materials. Biasing components, e.g., Zener diode circuits, resistor-capacitor circuits, etc., can be utilized (not shown) when desired to provide suitable biasing to T1 and T2. In configurations where T1 and T2 are bipolar or other current-biased transistors, biasing components (e.g., resistors or transistor-based circuits) can provide at least a threshold current to the respective bases of T1 and T2.

In certain embodiments, T1 can be a p-type FET, and T2 can be an n-type FET. In other embodiments, T1 and T2 can be bipolar transistors having NPN or PNP-type components. T1 and T2 can also include radio frequency or power transistors. The transistors T1 and T2 can be electrically coupled to a supply voltage 43. The output terminal 35 of the DLR 30 can be positioned at the common node of the transistors T1 and T2. In one embodiment where T1 and T2 are MOSFET's, the source of T1 can be electrically connected to a positive supply voltage 43; the drains of T1 and T2 can be electrically coupled together; and the source of T2 can be electrically connected to the ground.

A feedback line 48 can be configured to provide a feedback signal from the output terminal of the summing circuit 38 to the non-inverting input (shown as a plus sign) of the comparator 34. Such a feedback signal is utilized to regulate when either T1 or T2 is turned on or off. For example, T1 is turned on when a predetermined positive signal exists at the output of summing circuit 38. A current output (denoted as $I_{linear}$) is fed back to the PFM 26 of the SR 20 to aid in determining switching frequencies of the SR 20. Specifically, the current $I_{linear}$ from the DLR 30 provides information of an envelope signal for the PFM 26, and the SR 20 changes a switching frequency according to a slew rate of the envelope signal.

Figures 3A, 3B:
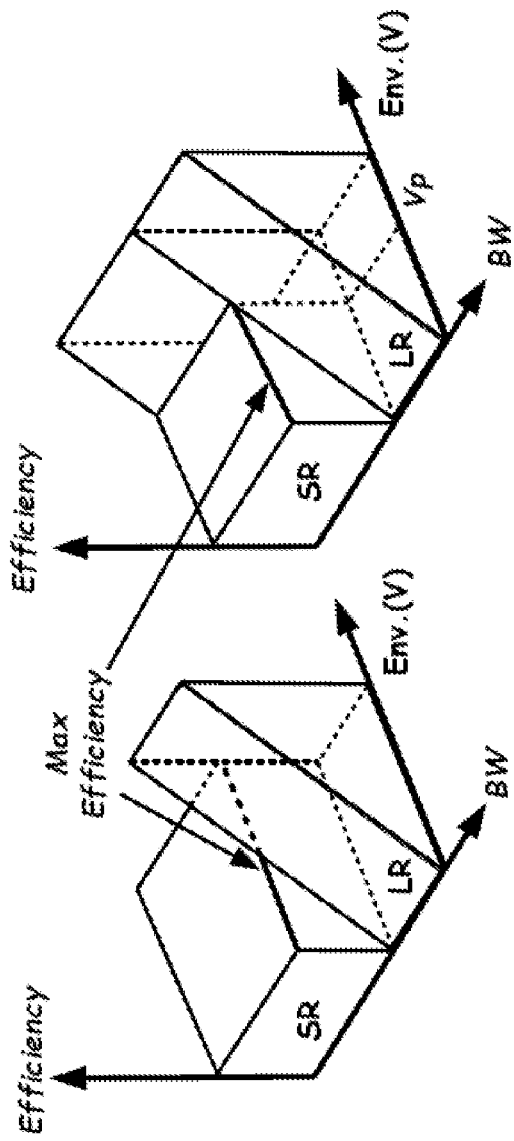
FIGS. 3A and 3B show performance characteristics of supply modulators based on various configurations.

FIGS. 3A and 3B show a comparison of achievable efficiencies between a first supply modulator utilizing only frequency partitioning, and a second supply modulator utilizing both frequency and voltage partitioning. As shown in FIGS. 3A and 3B, utilizing both frequency and voltage partitioning can result in at least 10% improvement in average efficiency as compared to utilizing only frequency partitioning. It is also to be appreciated that the embodiments herein can enhance linear amplification of highly spectral-efficient amplitude-and-phase modulated RF signals, using, for example class-AB and Doherty topologies to provide highly linear envelope tracking power amplifiers.

Moreover, AM-AM and AM-PM distortion compensation circuits can also be incorporated herein for the ETPAs. To avoid transistor break-down, low-loss power combining techniques can be integrated to satisfy the large output power requirement (+20 dBm). Although linear PA with SuMo 200 (e.g. ETPA, Doherty PA) provides back-off efficiency and linearity, overall efficiency is limited by the class-AB nature of the PA. Hence, RF-DACs with highly non-linear PA are also capable of being utilized herein to address this concern. As an alternative to ETPA, inverse class-F PA topology for the RF-DAC is also configurable with the designs herein. Inverse class-F has the benefit of using lower-harmonic frequency component matching to achieve similar efficiency compared to class-F. To cover both 71-76 GHz and 81-86 GHz frequency bands, a switched inductor topology cab be utilized to enable narrowband PA for power-efficient band switching.

From the foregoing, it will be appreciated that specific embodiments of the disclosure have been described herein for purposes of illustration, but that various modifications can be made without deviating from the disclosure. In addition, many of the elements of one embodiment can be combined with other embodiments in addition to or in lieu of the elements of the other embodiments. Accordingly, the technology is not limited except as by the appended claims.

We claim:

1. An envelope tracking supply modulator, comprising:
   a split-path input configured to receive an envelope signal having an amplitude;
   a switching regulator coupled to the split-path input and including:
      a pre-amplifier having an input coupled to the envelope signal and another input coupled to a threshold voltage signal; and
      a pulse frequency modulator and a pulse width modulator both coupled to the pre-amplifier, wherein the pulse frequency modulator and the pulse width modulator are configured to operate alternately to generate a switched signal based on a comparison result between the envelope signal and the threshold voltage signal at the pre-amplifier;
   a digital linear regulator also coupled to the split-path input and configured to generate a linear output signal based on the received envelope signal; and
   a summing circuit electrically coupled to the switching regulator and the digital linear regulator and configured to sum the switched signal and the linear output signal to produce a summed signal that generally tracks the amplitude of the envelop signal.

2. The envelope tracking supply modulator of claim 1, further comprising a current feedback path configured to provide a current signal from an output of the digital linear regulator to the pulse frequency modulator, wherein:
   the pulse frequency modulator is configured to modulate a switching frequency according to a slew rate of the envelope signal when the comparison result indicates that the envelope signal has a value lower than or equal to the threshold voltage signal at the pre-amplifier; and
   the pulse width modulator is configured to provide a current source with a constant frequency when the comparison result indicates that the envelope signal has a value higher than the threshold voltage signal at the pre-amplifier.

3. The envelope tracking supply modulator of claim 1, further comprising a power amplifier coupled to the summing circuit, the power amplifier being configured to receive the summed signal and produce a power signal for modulation of the envelop signal according to the summed signal.

4. The envelope tracking supply modulator of claim 1 wherein:
   the envelop signal has a first frequency and a second frequency higher than the first frequency;
   the switching regulator is operable at or below the first frequency; and
   the digital linear regulator is operable at or above the first frequency but below the second frequency.

5. The envelope tracking supply modulator of claim 4 wherein the first frequency is about 150 MHz, 200 MHz, 250 MHz, or 300 MHz.

6. The envelope tracking supply modulator of claim 1 wherein the digital linear regulator includes a digital control loop configured to regulate an output voltage of the digital linear regulator by selectively turning unit cells on/off in a power network.

7. The envelope tracking supply modulator of claim 6 wherein the power network is one of a Metal Oxide Field Effect Transistor (MOSFET) power network, a Metal Semiconductor Field Effect Transistors (MESFET) power network, or a bipolar transistor power network.

8. The envelope tracking supply modulator of claim 1 wherein the threshold voltage signal defines a switching point between operating in a digital linear regulator-slave mode (DLSM) and a digital linear regulator-master mode (DLMM) for the envelope tracking supply modulator.

9. The envelope tracking supply modulator of claim 1, further comprising a current feedback path configured to provide a current signal from an output of the digital linear regulator to the pulse frequency modulator, wherein the pulse frequency modulator is further configured to modulate a switching frequency according to a slew rate of the envelope signal.

10. A method of operation in an envelope tracking supply modulator, the method comprising:
    receiving an envelope signal at a mode setting pre-amplifier of a switching regulator having a pulse width modulator and a pulse frequency modulator both coupled to an output of the pre-amplifier;
    comparing the received envelope signal to a threshold voltage signal at the pre-amplifier;
    in response to determining that the envelope signal does not exceed the threshold voltage signal at the pre-amplifier, allowing the pulse frequency modulator to modulate a switching frequency of a switched signal according to a slew rate of the envelope signal while disallowing the pulse width modulator to operate; and
    in response to determining that the envelope signal exceeds the threshold voltage signal at the pre-amplifier, allowing the pulse width modulator to provide the switched signal as a current source with a constant frequency while disallowing the pulse frequency modulator to operate.

11. The method of claim 10 wherein:
the received envelop signal is a first envelop signal at a first frequency range; and
the method further includes:
  receiving a second envelop signal at a second frequency range higher than the first frequency range;
  amplifying the received second envelope signal to a linear output signal utilizing a digital linear amplifier; and
  combining the switched signal and the linear output signal to generate a summed signal.

12. The method of claim 10 wherein:
the received envelop signal is a first envelop signal at a first frequency range; and
the method further includes:
  receiving a second envelop signal at a second frequency range higher than the first frequency range;
  amplifying the received second envelope signal to a linear output signal utilizing a digital linear amplifier;
  combining the switched signal and the linear output signal to generate a summed signal; and
  providing the summed signal to a power amplifier to generate a power signal for modulation of the first and second envelop signals according to the summed signal.

13. The method of claim 10 wherein:
the received envelop signal is a first envelop signal at a first frequency range; and
the method further includes:
  receiving a second envelop signal at a second frequency range higher than the first frequency range;
  amplifying the received second envelope signal to a linear output signal utilizing a digital linear amplifier; and
  providing the linear output signal to the pulse frequency modulator, the linear output signal including information of the slew rate of the first envelope signal.

14. The method of claim 10, further comprising providing a feedback signal from an output of the pulse width modulator to regulate the constant frequency of the switched signal.

15. The method of claim 10 wherein:
the received envelop signal is a first envelop signal at a first frequency range; and
the method further includes:
  receiving a second envelop signal at a second frequency range higher than the first frequency range;
  amplifying the received second envelope signal to a linear output signal utilizing a digital linear amplifier;
  filtering the switched signal with a low pass filter; and
  combining the filtered switched signal and the linear output signal to generate a summed signal.

16. An envelope tracking supply modulator, comprising:
a pre-amplifier having an input coupled to an envelope signal and another input coupled to a threshold voltage signal;
a de-multiplexer coupled to an output of the pre-amplifier;
a pulse frequency modulator having an input coupled to an output of the de-multiplexer; and
a pulse width modulator having an input coupled to the output of the de-multiplexer, wherein the de-multiplexer is configured to allow the pulse frequency modulator to modulate a switching frequency to generate a switched signal according to a slew rate of the envelope signal or allow the pulse width modulator to provide the switched signal as a current source with a constant frequency, based on a comparison result between the envelope signal and the threshold voltage signal at the pre-amplifier.

17. The envelope tracking supply modulator of claim 16, further comprising:
a digital linear regulator configured to receive the envelope signal and generate a linear output signal based on the received envelope signal; and
a summing circuit electrically coupled to the switching regulator and the digital linear regulator and configured to sum the switched signal and the linear output signal to produce a summed signal that generally tracks the amplitude of the envelop signal.

18. The envelope tracking supply modulator of claim 17, further comprising a power amplifier coupled to the summing circuit, the power amplifier being configured to receive the summed signal and produce a power signal for modulation of the envelop signal according to the summed signal.

19. The envelope tracking supply modulator of claim 16 wherein:
the envelop signal has a first frequency and a second frequency higher than the first frequency;
the pulse frequency modulator or the pulse width modulator is operable at or below the first frequency; and
the digital linear regulator is operable at or above the first frequency but below the second frequency.

20. The envelope tracking supply modulator of claim 16, further comprising a current feedback path configured to provide a current signal from an output of the digital linear regulator to the pulse frequency modulator, the current signal containing information of the slew rate of the envelope signal.

* * * * *